(12) United States Patent
Peloski

(10) Patent No.: US 9,785,668 B2
(45) Date of Patent: *Oct. 10, 2017

(54) HIGH PERFORMANCE REAL-TIME RELATIONAL DATABASE SYSTEM AND METHODS FOR USING SAME

(71) Applicant: Aria Solutions, Inc., Calgary (CA)

(72) Inventor: Paul Peloski, Calgary (CA)

(73) Assignee: Aria Solutions, Inc., Calgary, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/202,516

(22) Filed: Jul. 5, 2016

(65) Prior Publication Data

US 2016/0314166 A1    Oct. 27, 2016

Related U.S. Application Data

(63) Continuation of application No. 14/137,445, filed on Dec. 20, 2013, now Pat. No. 9,384,237, which is a continuation of application No. 13/792,058, filed on Mar. 9, 2013, now Pat. No. 8,631,034.

(60) Provisional application No. 61/682,756, filed on Aug. 13, 2012.

(51) Int. Cl.
   *G06F 17/30* (2006.01)
   *G06F 17/50* (2006.01)

(52) U.S. Cl.
   CPC .. *G06F 17/30383* (2013.01); *G06F 17/30327* (2013.01); *G06F 17/30424* (2013.01); *G06F 17/30501* (2013.01); *G06F 17/5009* (2013.01)

(58) Field of Classification Search
   None
   See application file for complete search history.

(56) References Cited

U.S. PATENT DOCUMENTS

| | | | | |
|---|---|---|---|---|
| 2006/0031332 | A1* | 2/2006 | Brownholtz | H04L 12/1813 709/206 |
| 2008/0301098 | A1* | 12/2008 | Bernard | G06F 17/30572 |
| 2009/0037395 | A1* | 2/2009 | Ireland | G06F 17/30575 |
| 2009/0043729 | A1* | 2/2009 | Liu | G06F 17/30463 |
| 2009/0106214 | A1* | 4/2009 | Jain | G06F 17/30516 |
| 2009/0164433 | A1* | 6/2009 | R. | G06F 17/30867 |
| 2009/0216694 | A1* | 8/2009 | Lang | G06F 17/30516 706/12 |

(Continued)

Primary Examiner — Hung Le
(74) Attorney, Agent, or Firm — Galvin Patent Law LLC; Brian R. Galvin

(57) ABSTRACT

A database system supporting persistent queries, using a persistent query service and various data sources. On receiving a request to create a persistent query from a client software application, the persistent query service: creates a query virtual table; parses the persistent query; creates a plurality of intermediate virtual tables; establishes listeners for the query virtual table; creates a plurality of data source virtual tables; causes the plurality of data source virtual tables to retrieve initial data from data sources; and propagates data via intermediate virtual tables to the persistent query virtual table. On detection of a data change in a data source, the associated data source virtual table causes the data change to propagate via intermediate virtual tables to the persistent query virtual table, and the client software application executes client code of at least one listener.

14 Claims, 8 Drawing Sheets

(56) References Cited

U.S. PATENT DOCUMENTS

| | | | |
|---|---|---|---|
| 2010/0036831 A1* | 2/2010 | Vemuri | G06F 17/30516 707/707 |
| 2010/0082656 A1* | 4/2010 | Jing | G06F 17/3048 707/760 |
| 2010/0138405 A1* | 6/2010 | Mihaila | G06F 17/30516 707/713 |
| 2011/0153648 A1* | 6/2011 | Moore | H04L 67/06 707/769 |
| 2011/0161338 A1* | 6/2011 | Moore | H04L 41/046 707/758 |

* cited by examiner

HIGH PERFORMANCE REAL-TIME RELATIONAL DATABASE SYSTEM AND METHODS FOR USING SAME

CROSS-REFERENCE TO RELATED APPLICATIONS

This application is a continuation of U.S. patent application Ser. No. 14/137,445 titled "HIGH PERFORMANCE REAL-TIME RELATIONAL DATABASE SYSTEM AND METHODS FOR USING SAME", filed on Dec. 20, 2013, which is a continuation of U.S. patent application Ser. No. 13/792,058 titled "HIGH PERFORMANCE REAL-TIME RELATIONAL DATABASE SYSTEM AND METHODS FOR USING SAME", filed on Mar. 9, 2013, now issued as U.S. Pat. No. 8,631,034 on Jan. 14, 2014, which claims priority to U.S. provisional patent application Ser. No. 61/682,756, titled "HIGH-PERFORMANCE REAL-TIME RELATIONAL DATABASE SYSTEM AND METHODS FOR USING SAME", filed on Aug. 13, 2012. The disclosure of each of the above-referenced patent applications is hereby incorporated by reference in its entirety.

BACKGROUND OF THE INVENTION

Field of the Invention

The invention relates to the field of database management systems, and particularly to the field of real-time database systems supporting persistent queries using virtual table structures.

Discussion of the State of the Art

Business reporting or enterprise reporting is a fundamental part of identifying the capabilities and performance metrics within an organization to convert into knowledge to improve efficiency and overall performance of people, systems and processes within the organization. To support better business decision-making, businesses rely on large amounts of information (for example, transactional log files, interaction log files, system configuration information, human resource information, customer transaction data, path analytics, etc.) produced by management systems that provides managers with information about sales, inventories, and other data that would help in managing and improving the enterprise.

With the dramatic expansion of information technology, and a desire for increased competitiveness in corporations, there has been an enormous increase in the capture of large datasets representing every facet of business processing, customer transactions, and other data to understand and improve how the business functions (often referred to as 'Big Data"). As such, computing power to produce unified reports (for example, those that join different views of the enterprise in one place) has increased exponentially. This reporting process involves querying data sources with different logical models to produce a human readable report. For example, in a customer service communication center environment, a manager may query a human resources database, an employee performance database, a set of transactional logs, and real-time metrics to identify where resources may require improvement and further training. Furthermore, a problem that exists in many cases is that large organizations still have data in legacy systems where moving to a more robust, open-systems architecture is cost prohibitive. In other organizations, systems and data warehouses are developed as functional silos where every new system requires its own database and as a result, data follows a different schema and is often copied from system to system. In other situations, businesses have fundamentally different data sources that must remain separate (for example a communication server system and a customer experience database). As a result, businesses need to consolidate their disparate data while moving it from place to place, from one or more sources, and in different forms or formats. For example, a financial institution might have information on a customer in several departments and each department might have that customer's information listed in a different format. The customer service department might list the customer by name, whereas the accounting department might list the customer by number. In order to use the data to create a report from one or more data sources, the data may need to be bundled and consolidated into a uniform arrangement and stored in a database or data warehouse that may be used as the data source for report creation. The function to consolidate the data is typically handled by an extract, transform, and load (ETL) procedure. Extracting is the process of reading data from one or more source database. Transform is the process of converting the extracted data from its previous form into the form it needs to be in so that it may be placed into a target database where transformation occurs by using rules or lookup tables or by combining the data with other data. Load is the process of writing the data into the target data warehouse. A user would then use a special-purpose query language designed for managing data (for example, structured query language (SQL) known in the art) to identify what data elements are required for a business report.

The problem with systems known in the art is that the ETL process takes time to extract, transform and load the required data from the one or more data sources. The larger the dataset, the longer the process may take. In some installations where large data sets are involved processing ETL may be extremely slow, often taking hours or days. In these cases, costs are increased the ability to provide reports in a real-time or in a timely manner is often not possible. Furthermore reports may be inaccurate as data from the system has not yet been written. For example, in a contact center environment, it is desired to measure performance in 15 minute time increments in order to react to sudden increases or decreases in interaction traffic. Since a contact center is typically made up of many data sources (for example, agent information, customer profile information, transaction information, historical contact information, etc.) from multiple data sources (for example, private branch exchange (PBX) transaction information, routing information, configuration service information, etc.) the reports are typically not available after the 15 minute interval and perhaps not available for many hours afterwards thus rendering the real-time report inaccurate or unusable.

To remedy this situation, various techniques have been tried in the art, for example, a total in-memory database, but for a large application, such as in a high data throughput environment (for example, a large contact center or financial institution), the amount of memory that is required is massive where even modern systems cannot feasibly accommodate the memory requirements, and thus become cost-ineffective.

What is needed is a highly responsive system and methods for providing a real-time database capable of handling persistent queries that are very responsive to data updates and that support persistent and readily updates aggregations of data so that analysis and reporting systems may report in smaller time increments (for example, 15 minute intervals), while allowing for reports to become available very soon, if not immediately when a report is requested without a huge infrastructure.

SUMMARY OF THE INVENTION

Accordingly, the inventor has conceived and reduced to practice, in a preferred embodiment of the invention, a real-time database system that supports persistent queries, and various methods for using the same.

According to a preferred embodiment of the invention, a database system supporting persistent queries is disclosed, comprising a client software application operating on a computer comprising at least a listener comprising client code to be executed when the listener is invoked, a persistent query service stored and operating on a network-attached server computer or locally on a client computer and adapted to receive connections and requests from the client software application, and a plurality of network-attached data sources. On receiving a request to create a persistent query from the client software application, the persistent query service: creates a query virtual table corresponding to the persistent query; parses the persistent query to create a tree structure representing a logical arrangement of a plurality of operators that yield results required by the persistent query; creates a plurality of intermediate virtual tables corresponding to the plurality of operators, wherein the step of creating an intermediate virtual table further comprises establishing listeners associated with the intermediate virtual table to receive data change notifications; establishes listeners for the query virtual table to receive data change notifications from a plurality of intermediate virtual tables; creates a plurality of data source virtual tables, each corresponding to a specific data source required to fulfill the persistent query; causes the plurality of data source virtual tables to retrieve initial data from the plurality of data sources; and propagates data via the plurality of intermediate virtual tables and their associated listeners to the persistent query virtual table. On detection of a data change in a data source, the associated data source virtual table invokes a plurality of corresponding methods of listeners of a plurality of virtual intermediate tables and propagates the data change via the plurality of intermediate virtual tables and their associated listeners to the persistent query virtual table, and the client software application executes the client code of at least one affected listener.

According to another preferred embodiment of the invention, a method for providing persistent database queries is provided, the method comprising the steps of: (a) creating, via a software application executing on a computer, a persistent query; wherein the step of creating the persistent query further comprises establishing listeners with client code to receive notifications from the persistent query; (b) creating a query virtual table corresponding to the persistent query; (c) parsing the persistent query to create a tree structure representing a logical arrangement of a plurality of operators that yield results required by the persistent query; (d) creating a plurality of intermediate virtual tables corresponding to the plurality of operators; wherein the step of creating an intermediate virtual table further comprises establishing listeners associated with the intermediate virtual table to receive data change notifications; (e) establishing listeners for the query virtual table to receive data change notifications from a plurality of intermediate virtual tables; (f) creating a plurality of data source virtual tables, each corresponding to a specific data source required to fulfill the persistent query; (g) retrieving, by the plurality of data source virtual tables, initial data from the plurality of data sources; (h) invoking, by the plurality of data source virtual tables, row added methods of a plurality of intermediate virtual tables; (i) propagating data via the plurality of intermediate virtual tables and their associated listeners to the persistent query virtual table; (j) on detection of a data change in a data source, invoking by the associated data source virtual table of corresponding methods of listeners of a plurality of virtual intermediate tables; (k) propagating the data change via the plurality of intermediate virtual tables and their associated listeners to the persistent query virtual table; and (l) executing the client code of each affected listener in the query virtual table.

BRIEF DESCRIPTION OF THE DRAWING FIGURES

The accompanying drawings illustrate several embodiments of the invention and, together with the description, serve to explain the principles of the invention according to the embodiments. One skilled in the art will recognize that the particular embodiments illustrated in the drawings are merely exemplary, and are not intended to limit the scope of the present invention.

DETAILED DESCRIPTION

Figure 1:
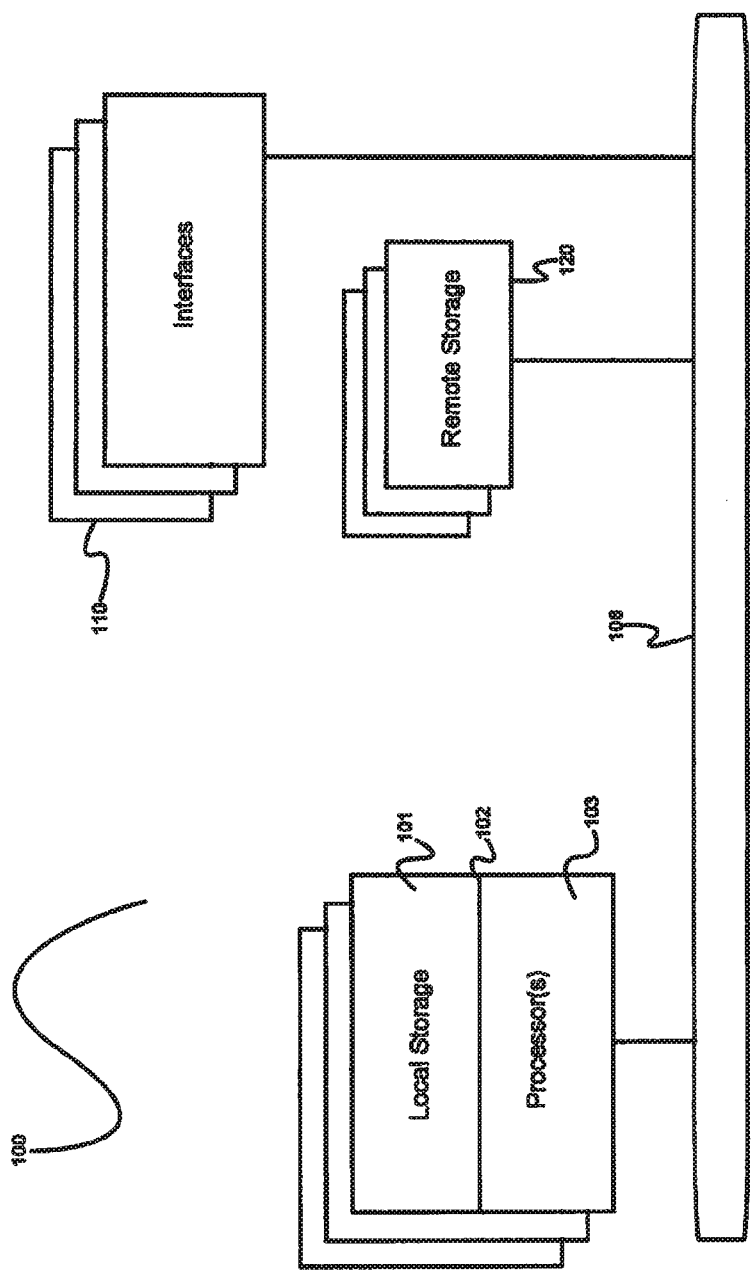
FIG. 1 is a block diagram illustrating an exemplary hardware architecture of a computing device used in an embodiment of the invention.

The inventor has conceived, and reduced to practice, a real-time database system that supports persistent queries, and various methods for using the same.

One or more different inventions may be described in the present application. Further, for one or more of the inventions described herein, numerous alternative embodiments may be described; it should be understood that these are presented for illustrative purposes only. The described embodiments are not intended to be limiting in any sense. One or more of the inventions may be widely applicable to numerous embodiments, as is readily apparent from the disclosure. In general, embodiments are described in sufficient detail to enable those skilled in the art to practice one or more of the inventions, and it is to be understood that other embodiments may be utilized and that structural, logical, software, electrical and other changes may be made without departing from the scope of the particular inventions. Accordingly, those skilled in the art will recognize that one or more of the inventions may be practiced with various modifications and alterations. Particular features of one or more of the inventions may be described with reference to one or more particular embodiments or figures that form a part of the present disclosure, and in which are shown, by way of illustration, specific embodiments of one or more of the inventions. It should be understood, however, that such features are not limited to usage in the one or more particular embodiments or figures with reference to which they are described. The present disclosure is neither a literal description of all embodiments of one or more of the inventions nor a listing of features of one or more of the inventions that must be present in all embodiments.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more intermediaries, logical or physical.

A description of an embodiment with several components in communication with each other does not imply that all such components are required. To the contrary, a variety of optional components may be described to illustrate a wide variety of possible embodiments of one or more of the inventions and in order to more fully illustrate one or more aspects of the inventions. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence.

When a single device or article is described, it will be readily apparent that more than one device or article may be used in place of a single device or article. Similarly, where more than one device or article is described, it will be readily apparent that a single device or article may be used in place of the more than one device or article.

The functionality or the features of a device may be alternatively embodied by one or more other devices that are not explicitly described as having such functionality or features. Thus, other embodiments of one or more of the inventions need not include the device itself.

Techniques and mechanisms described or referenced herein will sometimes be described in singular form for clarity. However, it should be noted that particular embodiments include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of embodiments of the present invention in which, for example, functions may be executed out of order from that shown or discussed, including substantially concurrently or in reverse order, depending on the functionality involved, as would be understood by those having ordinary skill in the art.

Definitions

A "persistent query", as used herein, is a query against one or more data sources (such as relational or non-relational database systems, spreadsheets, real time event sources, flat data files, and the like), which is maintained in an active state upon its creation until it is explicitly destroyed by the application that created it. Persistent queries, according to the invention, are incrementally updated each time one or more changes to an underlying data source occurs that affects at least one data element used by the persistent query. Thus applications (even those other than the application that created a persistent query) may use the data within a persistent query's result set at any time, without re-executing the query as is commonly done in the art, while being assured that the data is current as of the most recent incremental changes to the underlying data sources. Thus a typical use case of persistent queries is to support effectively real-time queries even in large systems that change automatically and substantially immediately in response to changes in one or more underlying data elements, without a user's or an application's having to re-run the query in its entirety.

"Extract, Transform and Load (ETL)", as used herein, refers to a process that migrates data from one database to another while, typically to form datamarts or data warehouses, o to convert databases from one format or type to another. The ETL function is made up of three steps. Extraction is the process of reading (extracting) data from a source database. "Transformation" is the process of converting the extracted data from its initial form into a form it needs to be in so that it may be placed into another database. Transformation occurs by using rules or lookup tables or by combining the data with other data. "Loading" is a process of writing the data into the target database.

"Structured query language (SQL)", as used herein, refers to a special-purpose programming language designed for loading, changing, deleting, querying, and otherwise managing data in relational database management systems. It should be understood by one having ordinary skill in the art that SQL is one of many data querying language or protocols known in the art, any of which may be used with persistent queries as described herein, without departing from the scope of the invention.

As used herein, a "virtual table" is an in-memory data table that is created and maintained as part of a persistent query, but that is not resident or included in any underlying data source (such as a relational database system). Some virtual tables, according to the invention, will actually store data in memory (and thus consume memory), where as others do not store data but simply act on data received from its data sources and send the results to other virtual tables that are configured as recipients of the virtual table's data (that is, for some virtual tables, data simply "passes through" and is acted on as it does so, while in other virtual tables data is actually stored persistently; typically the virtual table from which a user of a persistent query obtains results is of the latter type).

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be disclosed herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, and the like), a consumer electronic device, a music player, or any other suitable electronic device, router, switch, or the like, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or the like).

Referring now to FIG. 1, there is shown a block diagram depicting an exemplary computing device 100 suitable for implementing at least a portion of the features or functionalities disclosed herein. Computing device 100 may be, for example, any one of the computing machines listed in the previous paragraph, or indeed any other electronic device capable of executing software- or hardware-based instructions according to one or more programs stored in memory. Computing device 100 may be adapted to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 100 includes one or more central processing units (CPU) 102, one or more interfaces 110, and one or more busses 106 (such as a peripheral component interconnect (PCI) bus). When acting under the control of appropriate software or firmware, CPU 102 may be responsible for implementing specific functions associated with the functions of a specifically configured computing device or machine. For example, in at least one embodiment, a computing device 100 may be configured or designed to function as a server system utilizing CPU 102, local memory 101 and/or remote memory 120, and interface(s) 110. In at least one embodiment, CPU 102 may be caused to perform one or more of the different types of functions and/or operations under the control of software modules or components, which for example, may include an operating system and any appropriate applications software, drivers, and the like.

CPU 102 may include one or more processors 103 such as, for example, a processor from one of the Intel, ARM, Qualcomm, and AMD families of microprocessors. In some embodiments, processors 103 may include specially designed hardware such as application-specific integrated circuits (ASICs), electrically erasable programmable read-only memories (EEPROMs), field-programmable gate arrays (FPGAs), and so forth, for controlling operations of computing device 100. In a specific embodiment, a local memory 101 (such as non-volatile random access memory (RAM) and/or read-only memory (ROM), including for example one or more levels of cached memory) may also form part of CPU 102. However, there are many different ways in which memory may be coupled to system 100. Memory 101 may be used for a variety of purposes such as, for example, caching and/or storing data, programming instructions, and the like.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 110 are provided as network interface cards (NICs). Generally, NICs control the sending and receiving of data packets over a computer network; other types of interfaces 110 may for example support other peripherals used with computing device 100. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, Firewire™, PCI, parallel, radio frequency (RF), Bluetooth™, near-field communications (e.g., using near-field magnetics), 802.11 (WiFi), frame relay, TCP/IP, ISDN, fast Ethernet interfaces, Gigabit Ethernet interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 110 may include ports appropriate for communication with appropriate media. In some cases, they may also include an independent processor and, in some in stances, volatile and/or non-volatile memory (e.g., RAM).

Although the system shown in FIG. 1 illustrates one specific architecture for a computing device 100 for implementing one or more of the inventions described herein, it is by no means the only device architecture on which at least a portion of the features and techniques described herein may be implemented. For example, architectures having one or any number of processors 103 may be used, and such processors 103 may be present in a single device or distributed among any number of devices. In one embodiment, a single processor 103 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 120 and local memory 101) configured to store data, program instructions for the general-purpose network operations, or other information relating to the functionality of the embodiments described herein (or any combinations of the above). Program instructions may control execution of or comprise an operating system and/or one or more applications, for example. Memory 120 or memories 101, 120 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory, solid state drives, memristor memory, random access memory (RAM), and the like. Examples of program instructions include both object code, such as may be produced by a compiler, machine code, such as may be produced by an assembler or a linker, byte code, such as may be generated by for example a Java™ compiler and may be executed using a Java virtual machine or equivalent, or files containing higher level code that may be executed by the computer using an interpreter (for example, scripts written in Python, Perl, Ruby, Groovy, or any other scripting language).

Figure 2:
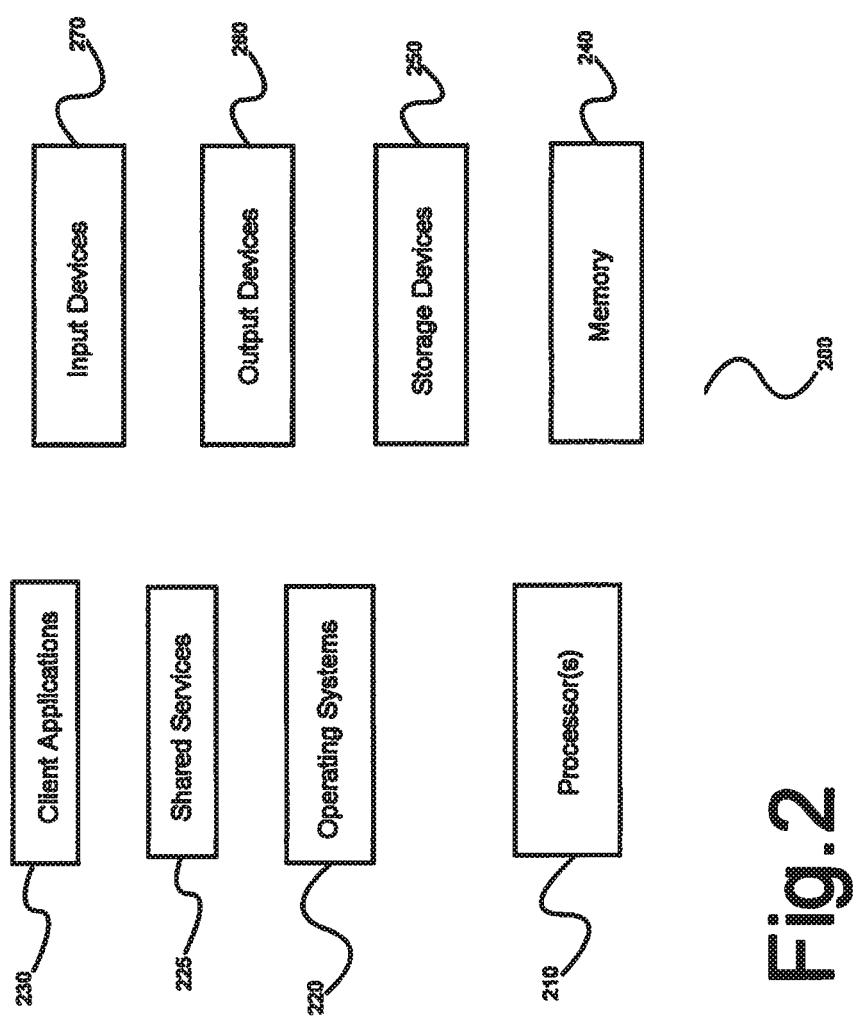
FIG. 2 is a block diagram illustrating an exemplary logical architecture for a client device, according to an embodiment of the invention.

In some embodiments, systems according to the present invention may be implemented on a standalone computing system. Referring now to FIG. 2, there is shown a block diagram depicting a typical exemplary architecture of one or more embodiments or components thereof on a standalone computing system. Computing device 200 includes processors 210 that may run software that carry out one or more functions or applications of embodiments of the invention, such as for example a client application 230. Processors 210 may carry out computing instructions under control of an operating system 220 such as, for example, a version of Microsoft's Windows™ operating system, Apple's Mac OS/X or iOS operating systems, some variety of the Linux operating system, Google's Android™ operating system, or the like. In many cases, one or more shared services 225 may be operable in system 200, and may be useful for providing common services to client applications 230. Services 225 may for example be Windows™ services, user-space common services in a Linux environment, or any other type of common service architecture used with operating system 210. Input devices 270 may be of any type suitable for receiving user input, including for example a keyboard, touchscreen, microphone (for example, for voice input), mouse, touchpad, trackball, or any combination thereof. Output devices 260 may be of any type suitable for providing output to one or more users, whether remote or local to system 200, and may include for example one or more screens for visual output, speakers, printers, or any combination thereof. Memory 240 may be random-access memory having any structure and architecture known in the art, for use by processors 210, for example to run software. Storage devices 250 may be any magnetic, optical, mechanical, memristor, or electrical storage device for storage of data in digital form. Examples of storage devices 250 include flash memory, magnetic hard drive, CD-ROM, and/or the like.

Figure 3:
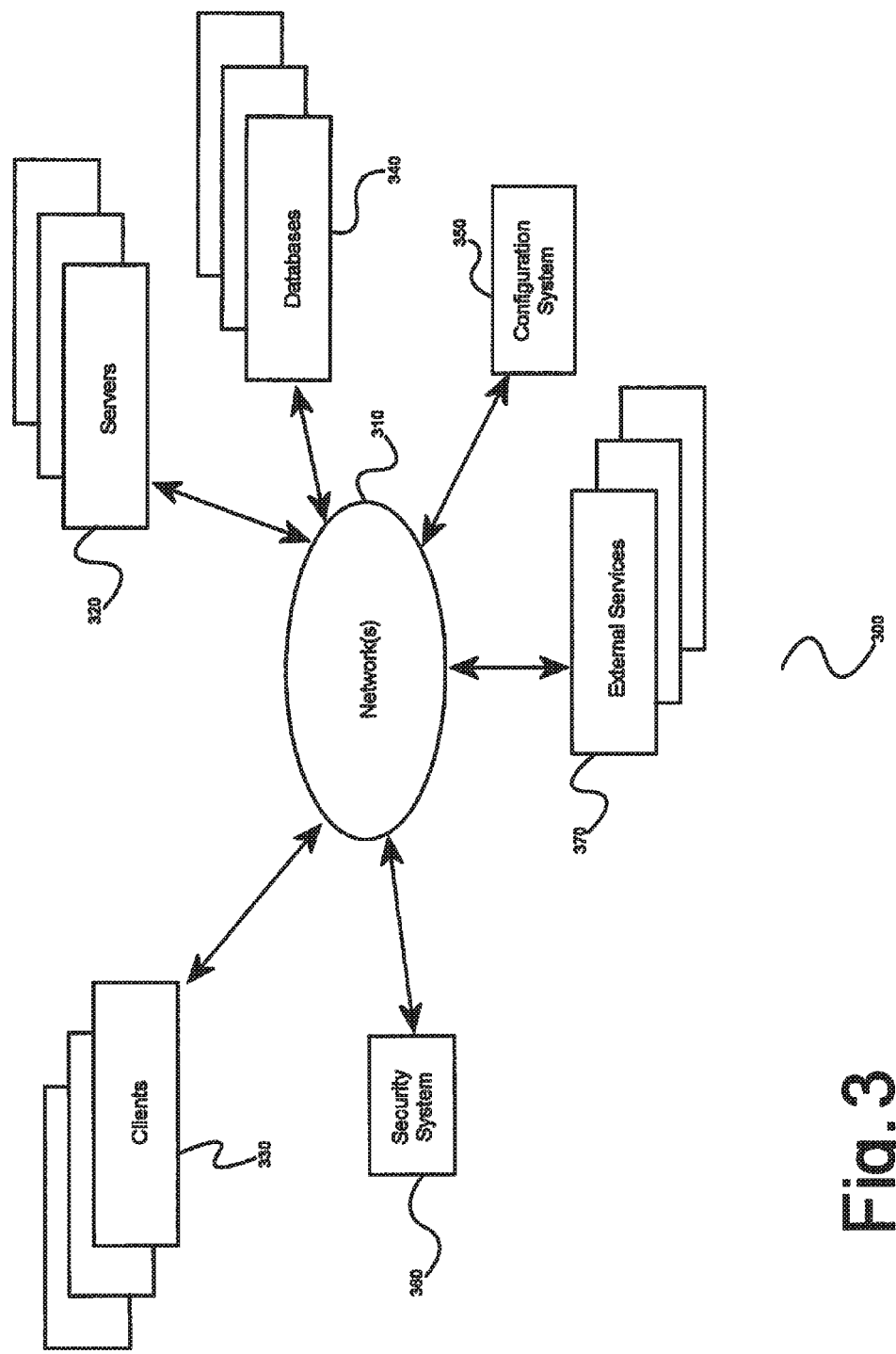
FIG. 3 is a block diagram showing an exemplary architectural arrangement of clients, servers, and external services, according to an embodiment of the invention.

In some embodiments, systems of the present invention may be implemented on a distributed computing network, such as one having any number of clients and/or servers. Referring now to FIG. 3, there is shown a block diagram depicting an exemplary architecture for implementing at least a portion of a system according to an embodiment of the invention on a distributed computing network. According to the embodiment, any number of clients 330 may be provided. Each client 330 may run software for implementing client-side portions of the present invention; clients may comprise a system 200 such as that illustrated in FIG. 2. In addition, any number of servers 320 may be provided for handling requests received from one or more clients 330. Clients 330 and servers 320 may communicate with one another via one or more electronic networks 310, which may be in various embodiments any of the Internet, a wide area network, a mobile telephony network, a wireless network (such as WiFi, Wimax, and so forth), or a local area network (or indeed any network topology known in the art; the invention does not prefer any one network topology over any other). Networks 310 may be implemented using any known network protocols, including for example wired and/or wireless protocols.

In addition, in some embodiments, servers 320 may call external services 370 when needed to obtain additional information, or to refer to additional data concerning a particular call. Communications with external services 370 may take place, for example, via one or more networks 310. In various embodiments, external services 370 may comprise web-enabled services or functionality related to or installed on the hardware device itself. For example, in an embodiment where client applications 230 are implemented on a smartphone or other electronic device, client applications 230 may obtain information stored in a server system 320 in the cloud or on an external service 370 deployed on one or more of a particular enterprise's or user's premises.

In some embodiments of the invention, clients 330 or servers 320 (or both) may make use of one or more specialized services or appliances that may be deployed locally or remotely across one or more networks 310. For example, one or more databases 340 may be used or referred to by one or more embodiments of the invention. It should be understood by one having ordinary skill in the art that databases 340 may be arranged in a wide variety of architectures and using a wide variety of data access and manipulation means. For example, in various embodiments one or more databases 340 may comprise a relational database system using a structured query language (SQL), while others may comprise an alternative data storage technology such as those referred to in the art as "NoSQL" (for example, Hadoop Cassandra, Google BigTable, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most embodiments of the invention may make use of one or more security systems 360 and configuration systems 350. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 360 or configuration system 350 or approach is specifically required by the description of any specific embodiment.

In various embodiments, functionality for implementing systems or methods of the present invention may be distributed among any number of client and/or server components. For example, various software modules may be implemented for performing various functions in connection with the present invention, and such modules may be variously implemented to run on server and/or client components.

Conceptual Architecture

Figure 4:
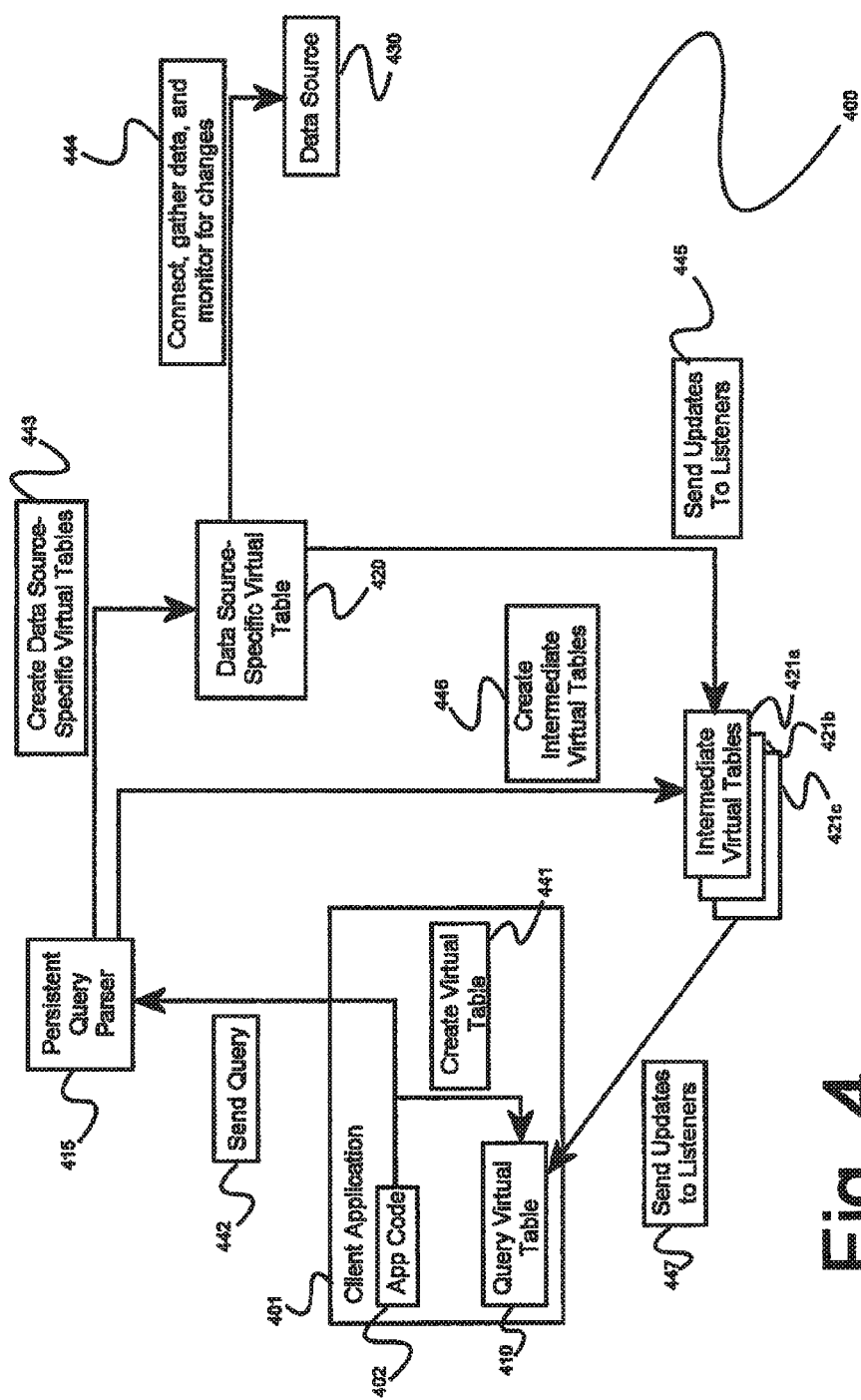
FIG. 4 is a block diagram of a conceptual architecture of a system according to a preferred embodiment of the invention.

FIG. 4 is a block diagram of a conceptual architecture of a system 400 according to a preferred embodiment of the invention. According to the embodiment, client application 401 is a software application running on a computer that makes use of one or more persistent query services in order to access a plurality of data sources 430, which may be comprised of one or more relational database systems, a set of data stored in memory of a computer, a flat file data store such as a file comprising transaction records, a server software running on a computer and adapted to provide notifications of various types to requesting clients (for example, a computer-telephony integration or CTI server, or a configuration server, each of which—and other server systems—provides a standards-based or proprietary application programming interface or API that allows other applications to receive data from the server software), or any other software or hardware system accessible to client application 401 on the same computing device or across a network. Client application 401 functions by receiving a query, via application code 402, that describes a desired set of data from one or more data sources 430 for the purposes of data analysis, reporting or another function. A query may include for example data insert, query, update and delete, schema creation and modification, data access control, and other data-centric operations typical of database query languages such as Structure Query Language (SQL). Queries include a list of one or more columns representing the desired data to be included in a final result. A query may also include operators and functions for calculating values on stored values, or on values passing through a virtual table as they are received from an underlying data source, and queries typically allow the use of expressions (for example, expressions that may produce either scalar values or tables consisting of columns and rows of data). In some embodiments, queries may be nested so that the results of one query may be used as a data source in the containing query via a relational operator or an aggregation function. A nested query is also known as a subquery. Once a query (herein, referred to as an "active query") is received by application code 402, a process of creating a virtual query table (herein, referred to as 'query table') representing the output of the query is commenced by invocation of a create virtual table function or operation 441. In order to populate a newly-created virtual table corresponding to the query, the query is sent to persistent query parser 415 by send query function or operation 442 to persistent query parser 415. persistent query parser 415 may in some embodiments be an integral part of, or may be connected by a network to, client application 401. It will be appreciated by one having ordinary skills in the art that there are various network protocols that may be used to allow software processes to communicate with each other. Persistent query parser 415 parses the active query by first finding delimiters in the query. Based on the position of the delimiters, persistent query parser 415 extracts various substrings of the elements delineated by the delimiters, creating a structured logical expression that encompasses the complete logical content of the original query in a form suitable for use by database systems (this is analogous to how relational database systems known in the art parse a received SQL query), and compiles the directives to determine a resultant set of data and relationships between various data sources that the active query is requesting. For example, a query "SELECT name, address FROM CustomerData WHERE agent='smith'" submitted to application code 402 would result in the creation of a virtual table with columns 'name' and 'address'. The rows of the persistent query table are the resulting data, based on the query directives. In this example, the resultant data would be customer name and address that were handled by an agent named 'smith'. Persistent query parser 415 then creates a virtual table tree representing, for example, the relationships, associations, data sources, etc. of the desired data as per the active persistent query. Persistent query parser 415 then creates one or more intermediate virtual tables 421 in the form of a virtual table tree, as well as one or more low level data source-specific virtual tables 420 as the nodes of the table tree that gather data from one or more data sources 430 (for example, a configuration service database, a flat file on a file system, a log file from a server, transaction information from a communication server, resource information from a relational database management system, or other data source). The persistent query virtual table and the intermediate virtual tables are created in a tree like structure with the nodes being one or more data source-specific virtual tables 420. In a preferred embodiment, intermediate virtual tables 421a may connect to one or more data source-specific virtual table 420 each connecting, gathering and monitoring for data changes 444 that occur in data source 430. For example data source-specific virtual table 420 may gather employee data from a human resource database data source 430. The data that is monitored is specific to the data requested in the active persistent query submitted to application code 402 (that is, the resultant data that is expected in the persistent query table) and only specific data required by intermediate virtual tables 421 and/or the query table is processed while other data is ignored. By gathering and monitoring the data that is needed the invention benefits from a considerable increase in performance as the amount of data that is needed for a persistent query is generally much less in quantity than all the data that is collected by RDBMS systems in typical systems known in the art. In addition to data fields created by persistent query parser 415 for each virtual table, persistent query parser 415 also creates one or more methods to perform actions on the data, data sources, or some other object and to trigger notifications to parent tables. For example, a data source-specific virtual table 420 creates a listener for the data source. Based on the characteristics of the active query, the listener gathers and monitors only data necessary to satisfy the active query (for example, the items in the SQL "WHERE clause"). For example, "SELECT name, address FROM CustomerData WHERE AgentID='1234'", a data source-specific virtual table 421*a* connected to a table, for example "Customer-Data" in data source 430. Data that would be passed up the virtual tree would be records having a field "AgentID" with a value of '1234'. Persistent query parser 415 would then set up all additional listeners to each virtual table so that when a data change happens in data source 430, only affected elements propagate up the tree (by sequential calls to listeners of interim virtual tables) until they get to the original active persistent query on client application 401, at which point any updates are passed to the client. In a preferred embodiment, a persistent query system 400 may include, but not limited to, SQL operators in Table 1.

TABLE 1

Example operators and their functions

| Operators | Function |
| --- | --- |
| SELECT | selects data from one or more database tables and/or views |
| INSERT INTO | facilitates the process of inserting data into a table |
| WHERE | works in conjunction with other SQL clauses like SELECT, INSERT and UPDATE to specify a search condition for these statements. |
| DISTINCT | works in conjunction with the SQL SELECT clause and selects only distinct (unique) datafrom a database table(s) |
| UPDATE | serves to update data in database table |
| DELETE | used to delete data from a database table |
| TRUNCATE TABLE | deletes all rows from a database table |
| ORDER BY | defines in what order to return a data set retrieved with a SQL SELECT statement. |
| Aggregate function such as SUM, AVG, MIN, etc. | used to sum, count, get the average, get the minimum and get the maximum values from a column or from a sub-set of column values |
| GROUP BY | used along with the SQL aggregate functions and specifies the groups where selected rows are placed |
| HAVING | provides a search condition for a group or aggregate used |
| AND and OR | together with the SQL WHERE clause to join two or more search conditions specified in the WHERE clause |
| JOIN | selects data from two or more tables tied together by matching table columns |
| UNION | merges the results of two or more SELECT SQL queries into one result set |

In another embodiment, a proprietary or open source query language may be used for managing data, linking, aggregation, projections, filters, macros, compositional syntax, establishing data types and functions, and creating persistent queries in a persistent query system 400.

Detailed Description of Exemplary Embodiments

Figure 5:
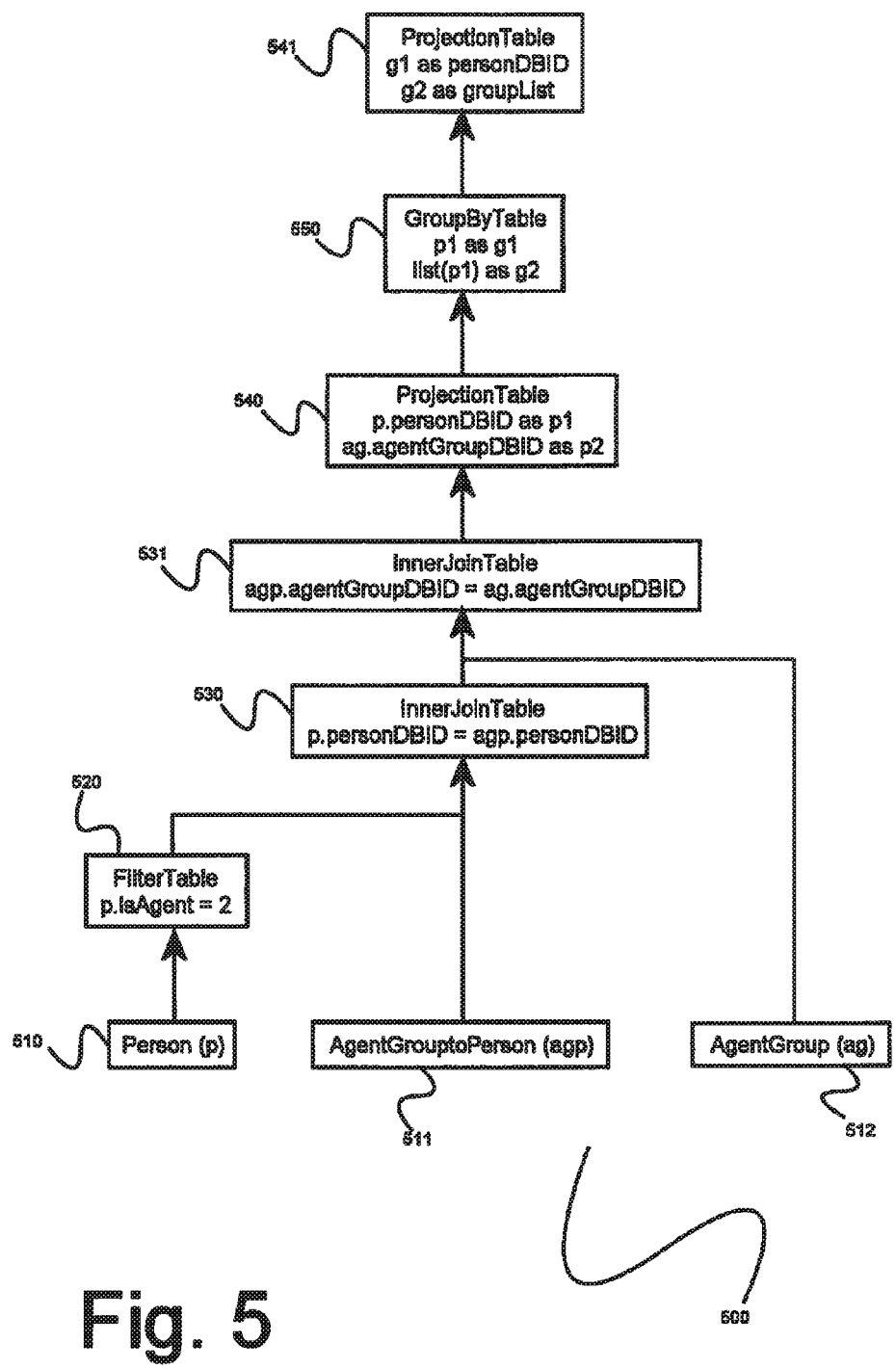
FIG. 5 is a diagram illustrating relationships between virtual tables for a first exemplary query, according to a preferred embodiment of the invention.

FIG. 5 is a diagram illustrating relationships between virtual tables for a first exemplary persistent query, according to a preferred embodiment of the invention. While exemplary query 500 is based on a common contact center-related use case, it should be understood that query 500 (and, for that matter, query 600 described below) are merely exemplary, and that queries created and used according to the present invention could be from any subject domain without departing from the scope of the invention. Exemplary query 500 is a virtual tree diagram outlining a query virtual table 441, a set of intermediate tables 421, and a set of data source specific virtual tables 420 for a sample query (herein, referred to as "sample query") that produces a table with one row per agent. Each row in the table set will have a person DBID of an agent and a list of agent group names of which the agent is a member, in a customer service communication environment. That is, a query that may be expressed in SQL as "SELECT p.personDbid AS personDbid, list(ag.agentGroupName) AS group List FROM Person p INNER JOIN AgentGroupToPerson agp ON p.personDbid=agp.personDbid INNER JOIN AgentGroup ag ON agp.agentGroupDbid=ag.agentGroupDbid WHERE p.isAgent=2 GROUP BY p.personDbid". Person table 510 is a data source-specific virtual table 420 that stores data, consumes memory, and has one or more records of persons within, for example, a customer service organization. For example, person virtual table 510 holds one thousand records of the names of the employees employed by the customer service communication center organization with details on their job function. The virtual table has an alias of "p" and may be referenced by this letter for query purposes. Agent group table 512 is another data source-specific virtual table 420 that stores data and consumes memory that has one or more records of agent groups within a customer service organization. For example, agent group virtual table 512 holds fifty records of the names of the agent groups based on group function (for example, billing group). Agent group to person table 511 is another data source-specific virtual table 420 that stores data, consumes memory, and has a one or more records of a list of persons and the agent groups to which each person belongs. For example, five hundred records of agents and the agent group ID to which they belong. Filter table 520 is a virtual table that manipulates data from person table 510 by applying a filter to the data to inner join table 530. For example, filter table 520 only requires the records from person virtual table 510 where field IsAgent=2 (that is, all records of persons who are agents). Of course, it would be understood by one having ordinary skill in the art that any logical expression may be used to filter data (for example, in a tax related table there may be a filter where a field t.SSN starts with 215). Inner join table 530 manipulates data when there is a match between filtered results of person table 520 (that is, where the person is an agent) and agent group person table 511 and combines the data together. For example, when the DBID of the person from the filtered results from person table 510 are compared to the person DBIDs of agent group to person table 511, a virtual table of agents and each agent group to which they belong is created. Inner join table 531 manipulates data when there is a match between data from inner join table 530 and agent group table 512. For example, a table is created with persons and a name of the agent groups to which they belong, when agent group DBID record from the table created by inner join table 530 matches group DBID from agent group table 512. Projection table 540 is a table that stores data, consumes memory, and creates an alias for required data, based on the sample query. For example, personDBID from person table 510 may be referenced as p1 and agent group name from agent group table 512 may be referenced as p2 for the purpose of, for example, convenience. Group by table 550 aggregates (that is, consolidates and calculates) column values from projection table 540 into a single record value. For example, one row per agent with each row in the result having the person DBID and a list of agent group names that agent is a member of. Projection table 541 is a table that stores data, consumes memory, and creates an alias for required data, based on the sample query. For example, g1 from group by table 550 may be referenced as personDbid and a list of agent group names referred to as g2 may be referred to as groupList for the purpose of, for example, labeling and readability.

Figure 6:
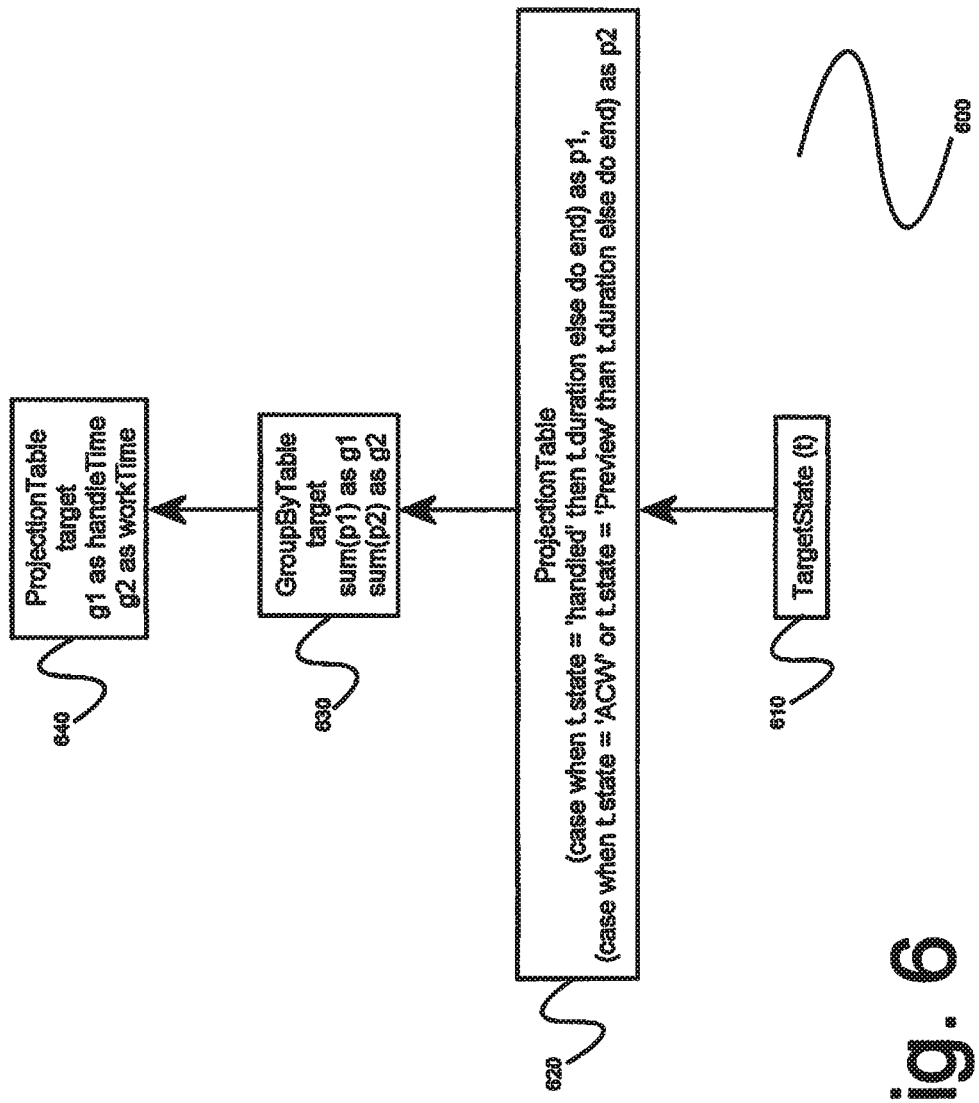
FIG. 6 is a diagram illustrating relationships between virtual tables for a second exemplary query, according to a preferred embodiment of the invention.

FIG. 6 is a diagram illustrating relationships between virtual tables for a second exemplary persistent query, according to a preferred embodiment of the invention. Exemplary query 600 (again, query 600 is intended as an example of a persistent query according to the invention, but it should be understood that the invention is in no way limited to queries having to do with contact centers or any other subject domain) is a virtual tree diagram outlining a query virtual table 441, a set of intermediate tables 421, and a data source specific virtual table 420 for a sample query (herein, referred to as "sample query") that produces a table of a basic workforce management (WFM) report with handle time (time spent on a call) and work time (time spent in after call work (ACW) or previewing an outbound call) for agents in a customer service communication center environment. That is, a query that may be expressed in SQL as "SELECT t.target AS target, SUM(CASE WHEN t.state='Handled' THEN t.duration ELSE 0 END) AS handleTime, SUM(CASE WHEN t.state='ACW' OR t.state='Preview' THEN t.duration ELSE 0 END) AS workTime FROM TargetState t GROUP BY t.target". Target state table 610 is an infinite virtual table that generates rows but does not store them from data source 430 (for example, a transactional event log from a communications server). Target state table 610 may generate a row each time a notification is received when a transactional event occurs in data source 430. The infinite nature of the table is due to the continuous creation of data rows while the sample query is active. Projection table 620 is a virtual table that manipulates data from target state table 610. In this example, if field "state" in target state table 610 has a value of 'Handled', the value of data field "duration" is stored in p1 otherwise if field "state" in target state table 610 has a value of 'ACW' or 'Preview', the value of data field "duration" is stored in p2. In this example, a value of 'Handled' refers to a transaction that was handled by an agent and 'duration' holds an amount of time that said agent spent handling the transaction. A value 'ACW' refers to a transaction that relates to after call work for an agent with duration equal to the value in the data field 'duration'. A value of 'Preview' refers to an agent that spent time previewing information for an outbound call. The time said agent spent on previewing the outbound call is that value stored in the field 'duration'. Group by table 630 aggregates column values from projection table 620 into a single record value. For example, for each agent total handle time is calculated by summing p1 values from projection table 620 and calculating total work time by summing p2 values from projection table 620. Projection table 640 is a table that stores data, consumes memory, and creates an alias for the sample query. For example, g1 from group by table 630 may be referenced as handleTime representing the handle time for the agent. Additionally, g2 may be referenced as workTime representing the total work time for agents in target state table 610 for the purpose of, for example, labeling and readability. Example persistent query 600 continues to produce data in the query table as long as the sample query remains active. This is an improvement over systems known in the art in that only the data that is needed is filtered and passed up the virtual table tree to produce the required table of results. This makes it feasible when processing large data sets particularly in real-time systems to provide highly-responsive performance even when frequent incremental changes are made to one or more underlying data sources. In particular, the invention makes it unnecessary for a query to be executed fully to refresh a result set each time a change occurs in an underlying data source, as is commonly done in the art today; rather than executing a complex query that may comprise numerous logical operations, data aggregations, and computations each time underlying data changes occur, according to the invention it is only necessary to update those elements of a persistent query that are affected by any specific changes to underlying data sources, while leaving all other elements in a result set unchanged.

Figure 7:
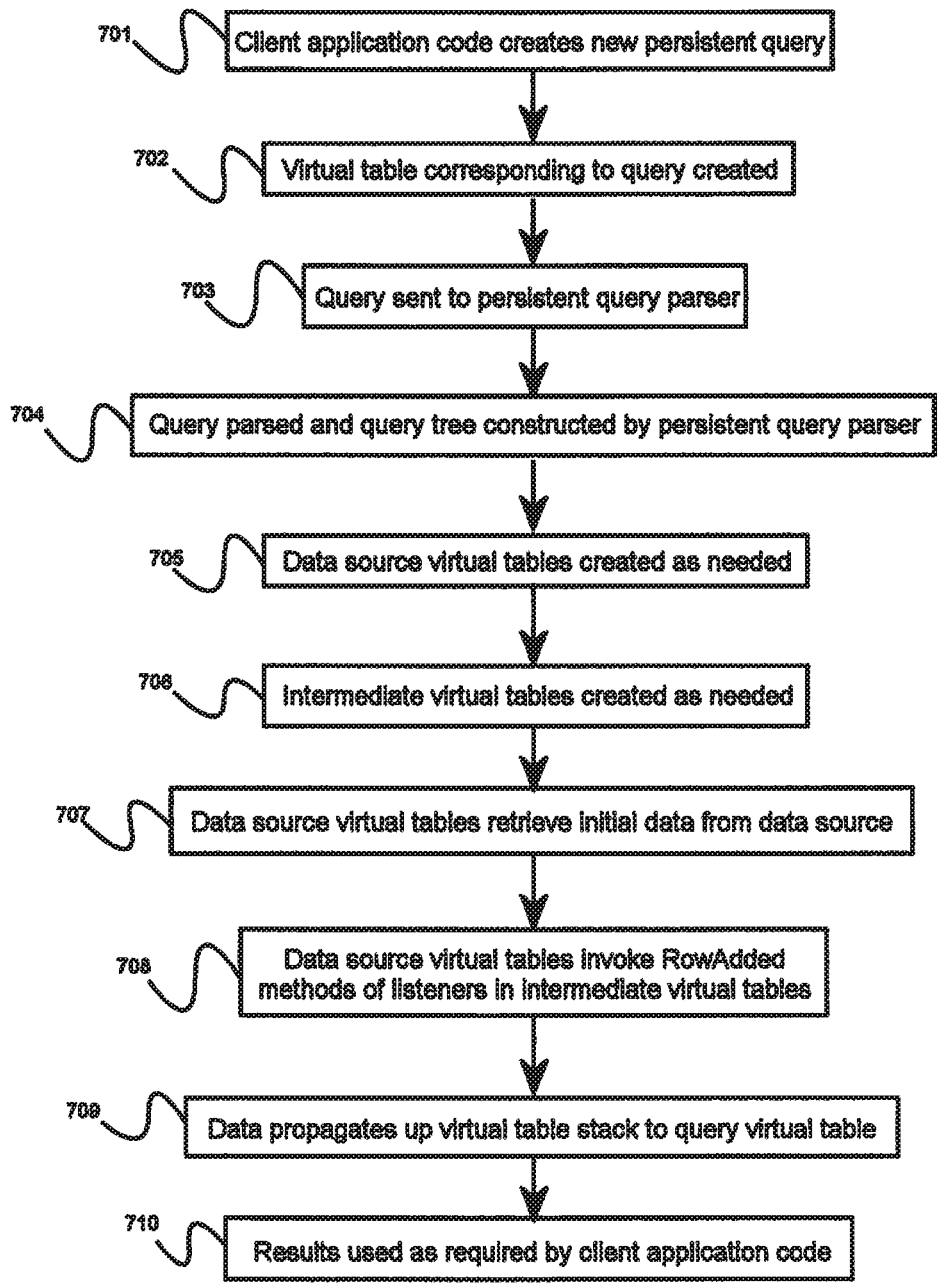
FIG. 7 is a process flow diagram illustrating a method for setting up a dynamic real-time data query, according to a preferred embodiment of the invention.

FIG. 7 is a process flow diagram illustrating a method for setting up a dynamic persistent real-time data query, according to a preferred embodiment of the invention. In step 701, client application 401 creates a new query. In step 702, create virtual table 441 creates a virtual table with a structure that represents the desired data (for example, a set of columns for each data element that is desired); at this point, no data exists in the created virtual table. The query is submitted via application code 402 to LiveSQ parser 415 in step 703. The query is parsed and a tree structure representing the intermediate virtual tables that are required for the query is created. Persistent query parser 415 identifies which data sources are required for the query and a data source specific virtual table 420 is created for each data source (for example, a RDBMS, a configuration service database, a transactional log file, a flat file, or some other repository of data) in step 705. Data source specific virtual tables are responsible for monitoring one or more data source 430 to identify when new data is available that may be needed from the query in step 701. In step 706, persistent query parser 415 creates the intermediate tables required to combine, process and move data up the tree to the persistent query virtual table created in step 702. In some embodiments, virtual tables may generate output the console when an event occurs (for example, when a new row appears). In another embodiment, an optimization process may decide to change the table structure dynamically to an equivalent but faster version. While client application 401 maintains the persistent query in step 701 active, the query virtual table 441, intermediate virtual tables 421, and data specific virtual tables 420 stay active and monitor the child tables and/or data sources accordingly. In step 707, data source specific virtual table 420 receives initial data from data source 430. The data that data source specific virtual table 420 receives is specific to what is required for the persistent query from step 701. In step 708, data source specific virtual table 420 invokes one or more methods to perform actions on the data, data sources, or some other object (for example, a listener method to identify when a row has been added to an intermediate virtual table 421, a data source specific virtual table 420, and/or to a data source 430, a listener object). In some embodiments, intermediate virtual table 421a may change an incoming row-added into a row-changed or some other notification. In another embodiment, intermediate virtual table 421b may also hide incoming notifications. In another embodiment, intermediate virtual table 421c will let the notification pass through but may change the data (for example, the query in step 701 may require data to be combined with other data sources or calculated as an average, or some other change that is required). In step 709, the data propagates up the virtual tree structure and is added to intermediate virtual table 421a as necessary. In some embodiments, an intermediate virtual table 421, data source specific virtual table 420, or other virtual table in the virtual table tree structure may only receive events and not store data. In another embodiments, an intermediate virtual table 421, data source specific virtual table 420, or other virtual table in the virtual table tree structure, data may pass through and apply joins (for example, to query data from two or more data specific virtual table 420, intermediate virtual tables 421, or other virtual tables in the tree structure based on a relationship between certain columns in these tables). In another embodiment, an intermediate virtual table 421, data source specific virtual table 420, or other virtual table in the virtual table tree structure, data may be kept in memory for future processing by other methods or to be used by intermediate virtual tables 421, or for some other purpose. In step 709, results propagate up to persistent query virtual table 441 created in step 702 representing the query from step 701. In step 710, client application 401 may use the resulting data for aggregation or calculations. While the query from step 701 remains active, persistent query virtual table 441 created in step 702 will continue to be updated as new data arrives in data source specific virtual table 420 and or/intermediate virtual tables 421.

In some embodiments of the invention, frequently reused virtual tables may be maintained even when all current persistent queries that use them have been deleted by the applications that created them, in order to further improve system performance. In such embodiments, when a new persistent query is created by an application, any virtual tables required that have been maintained can be immediately used without running any queries against underlying data sources (since the still-maintained virtual tables will be populated by data that reflects that latest changes to any underlying data sources), thus enabling rapid creation and execution of new persistent queries.

Figure 8:
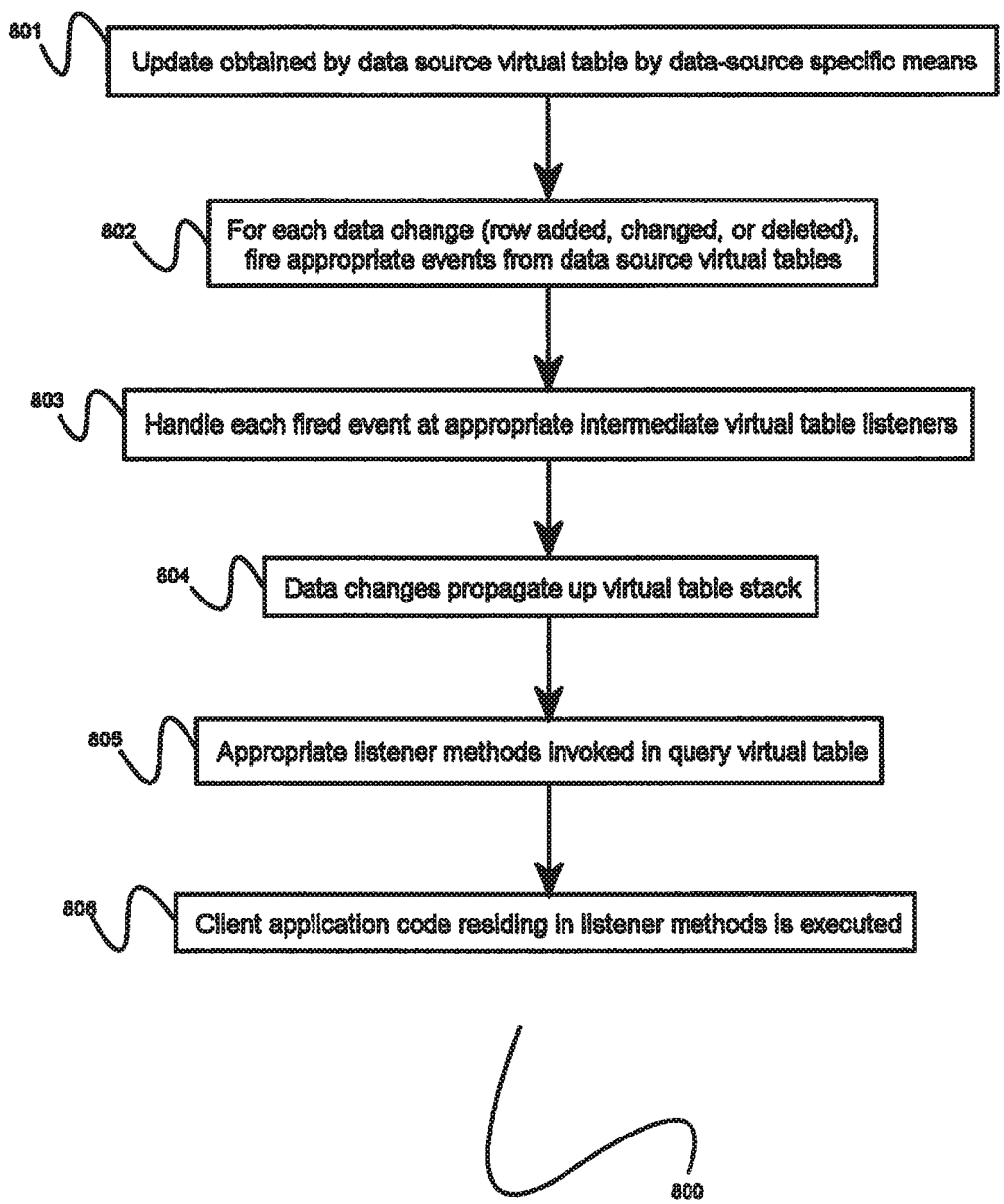
FIG. 8 is a process flow diagram illustrating a method for handling changes in source data within a dynamic real-time data query, according to a preferred embodiment of the invention.

FIG. 8 is a process flow diagram illustrating a method for handling changes in source data within a persistent real-time data query, according to a preferred embodiment of the invention. In step 801, data source specific virtual table 420 receives a notification that there is an event with respect to data in data source 430. In this example, data events will be accepted or ignored based on the requirements of a persistent query submitted via client application 401 (herein, referred to as an "active query" or a "persistent query"). For example, one or more rows have been added, and/or one or more rows have changed, and/or one or more rows have been deleted or a combination of these. Event notifications from data source 430 may depend on the specific data source, for example, a data source 430 that is a configuration service, or another type of data source may provide notification when changes occur. A data source 430 that is a telephony server or another type data source may require that data source-specific virtual table 420 register for object notification within data source 430 so that it may listen to for changes. In another embodiment, data source 430 may be an RDBMS database (for example, postgres, or another data base management system known in the art) that provides notification triggers to notify data source-specific virtual table 420 with notifications that data may have changed (for example, row added, changed, or deleted). For a data source 430 that does not support notification triggers (for example, a low functionality database, a flat file, or spreadsheet), data source-specific virtual table 420, or a manual configuration, may invoke a method to use an internal database trigger or file function to write to a log whenever changes (for example row added, changed, or deleted) occur. The log may be periodically checked by data source-specific virtual table 420 to retrieve necessary data for the active query. In step 802, when a data change that is required for the active query, data source-specific virtual table 420 notifies the parent intermediate virtual table 421c that data has changed (for example, a row has been added). In step 803, as data propagate up the virtual table tree creates by persistent query parser 415, parent virtual table intermediate virtual table 421b may use the data (for example to join to another set of data from a different source for aggregation, to calculate averages or some other value using the data, etc.). In step 804, intermediate virtual table 421b then notifies the parent intermediate virtual table 421c that data has changed by firing the appropriate event and so on to propagate the change up the virtual table stack until in step 805, the query virtual table 441 listener methods are invoked and query virtual table 441 is updated with data that represents the output of the query. In step 806, client application code residing in listener is executed and data is available to client application 401.

The skilled person will be aware of a range of possible modifications of the various embodiments described above. Accordingly, the present invention is defined by the claims and their equivalents.

What is claimed is:

1. A database system supporting persistent queries, the system comprising:
 a persistent query service stored and operating on a network-attached computer adapted to receive connections and requests from client software applications; and
 a plurality of network-attached data sources;
 wherein, on receiving a request to create a persistent query from a client software application, the persistent query service:
 creates a query virtual table corresponding to the persistent query;
 creates a tree structure representing a logical arrangement of a plurality of operators that yield results required by the persistent query;
 creates a plurality of intermediate virtual tables corresponding to the plurality of operators, wherein the step of creating an intermediate virtual table further comprises establishing listeners associated with the intermediate virtual table to receive data change notifications;
 establishes listeners for the query virtual table to receive data change notifications from a plurality of intermediate virtual tables;
 causes the plurality of data source virtual tables to retrieve initial data from the plurality of data sources; and
 propagates data via the plurality of intermediate virtual tables and their associated listeners to the persistent query virtual table; and
 wherein, on detection of a data change in a data source, a plurality of corresponding methods of listeners of a plurality of virtual intermediate tables are invoked, and the data change is propagated via the plurality of intermediate virtual tables and their associated listeners to the persistent query virtual table.

2. The system of claim 1, wherein at least one intermediate virtual table is a projection table.

3. The system of claim 1, wherein at least one intermediate virtual table is a group-by table.

4. The system of claim 1, wherein at least one intermediate virtual table is an inner join table.

5. The system of claim 1, wherein at least one intermediate virtual table is a filter table.

6. The system of claim 1, wherein the plurality of corresponding methods is drawn from the set of RowAdded, RowDeleted, and RowChanged methods.

7. The system of claim 1, wherein the persistent query service is stored and operable on a cloud platform computer accessible from mobile client devices.

8. A method for creating and using persistent queries in a database system, the method comprising the steps of:
  (a) creating at a persistent query service stored and operating on a network-attached computer, via a request delivered across the network from a software application executing on a computer, a persistent query, wherein the step of creating the persistent query further comprises establishing listeners with client code to receive notifications from the persistent query;
  (b) parsing the persistent query to create a tree structure representing a logical arrangement of a plurality of operators that yield results required by the persistent query;
  (c) creating a plurality of intermediate virtual tables corresponding to the plurality of operators; wherein the step of creating an intermediate virtual table further comprises establishing listeners associated with the intermediate virtual table to receive data change notifications;
  (d) establishing listeners for the query virtual table to receive data change notifications from a plurality of intermediate virtual tables;
  (e) retrieving, by the plurality of data source virtual tables, initial data from the plurality of data sources;
  (f) invoking row added methods of a plurality of intermediate virtual tables;
  (g) propagating data via the plurality of intermediate virtual tables and their associated listeners to the persistent query virtual table;
  (h) on detection of a data change in a data source, invoking corresponding methods of listeners of a plurality of virtual intermediate tables;
  (i) propagating the data change via the plurality of intermediate virtual tables and their associated listeners to the persistent query virtual table; and
  (j) executing the client code of each affected listener in the query virtual table.

9. The method of claim 8, wherein at least one intermediate virtual table is a projection table.

10. The method of claim 8, wherein at least one intermediate virtual table is a group-by table.

11. The method of claim 8, wherein at least one intermediate virtual table is an inner join table.

12. The method of claim 8, wherein at least one intermediate virtual table is a filter table.

13. The method of claim 8, wherein the plurality of corresponding methods is drawn from the set of RowAdded, RowDeleted, and RowChanged methods.

14. The method of claim 8, wherein the persistent query service is stored and operable on a cloud platform computer accessible from mobile client devices.

* * * * *